US012603300B2

(12) United States Patent
Hall et al.

(10) Patent No.: US 12,603,300 B2
(45) Date of Patent: Apr. 14, 2026

(54) PULSED ELECTROCHEMICAL DEPOSITION OF ORDERED INTERMETALLIC CARBON COMPOSITES

(71) Applicant: THE JOHNS HOPKINS UNIVERSITY, Baltimore, MD (US)

(72) Inventors: Anthony Shoji Hall, Baltimore, MD (US); Yunfei Wang, Baltimore, MD (US)

( * ) Notice: Subject to any disclaimer, the term of this patent is extended or adjusted under 35 U.S.C. 154(b) by 743 days.

(21) Appl. No.: 17/779,109

(22) PCT Filed: Nov. 23, 2020

(86) PCT No.: PCT/US2020/061806

§ 371 (c)(1),
(2) Date: May 23, 2022

(87) PCT Pub. No.: WO2021/102415

PCT Pub. Date: May 27, 2021

(65) Prior Publication Data

US 2023/0006218 A1 Jan. 5, 2023

Related U.S. Application Data

(60) Provisional application No. 62/939,257, filed on Nov. 22, 2019.

(51) Int. Cl.
*H01M 4/88* (2006.01)
*B82Y 30/00* (2011.01)
(Continued)

(52) U.S. Cl.
CPC ............. *H01M 4/8853* (2013.01); *C22C 5/04* (2013.01); *C25D 3/567* (2013.01); *C25D 5/18* (2013.01);
(Continued)

(58) Field of Classification Search
None
See application file for complete search history.

(56) References Cited

U.S. PATENT DOCUMENTS 9,190,671 B2 11/2015 Anastasopoulos et al.

FOREIGN PATENT DOCUMENTS

CN 101626081 * 1/2010
CN 102247844 * 11/2011
(Continued)

OTHER PUBLICATIONS

Steele, et al., Materials for fuel-cell technologies. Nature 2001, 414 (6861), 345-352.
(Continued)

*Primary Examiner* — Jonathan Crepeau

(57) ABSTRACT

Metastable alloys have recently emerged as high-performance catalysts, extending the toolbox of binary alloy materials that can be utilized to mediate electrocatalytic reactions. In particular, nanostructured metastable ordered intermetallic compounds are particularly challenging to synthesize. Here the present invention is directed to a method for synthesizing sub-15 nm metastable ordered intermetallic Pd31Bi12 nanoparticles at room temperature, in a single step, by pulsed electrochemical deposition onto high surface area carbon supports. The resulting Pd31Bi12 nanoparticles displays a 7× enhancement of the mass activity relative to Pt/C and a 4× enhancement relative to Pd/C for the oxygen reduction reaction (ORR). The high performance of Pd31Bi12 nanoparticles is demonstrated to arise from reduced oxygen binding caused by alloying of Pd with Bi. The isolation of Pd-sites from each other facilitate methanol tolerant ORR behavior.

9 Claims, 11 Drawing Sheets

(51) Int. Cl.

| | |
|---|---|
| *B82Y 40/00* | (2011.01) |
| *C22C 5/04* | (2006.01) |
| *C25D 3/56* | (2006.01) |
| *C25D 5/00* | (2006.01) |
| *C25D 5/18* | (2006.01) |
| *C25D 5/54* | (2006.01) |
| *C30B 7/12* | (2006.01) |
| *C30B 29/52* | (2006.01) |
| *H01M 4/92* | (2006.01) |
| *H01M 8/1011* | (2016.01) |

(52) U.S. Cl.
CPC .............. *C25D 5/54* (2013.01); *C25D 5/617* (2020.08); *C30B 7/12* (2013.01); *C30B 29/52* (2013.01); *H01M 4/921* (2013.01); *H01M 4/926* (2013.01); *B82Y 30/00* (2013.01); *B82Y 40/00* (2013.01); *H01M 8/1011* (2013.01)

(56) References Cited

FOREIGN PATENT DOCUMENTS

| | | | |
|---|---|---|---|
| CN | 109755593 | * | 5/2019 |
| SU | 1190985 | | 11/1985 |

OTHER PUBLICATIONS

Wang, et al., Oxygen electrocatalysts in metal-air batteries: from aqueous to nonaqueous electrolytes. Chem. Soc. Rev. 2014, 43 (22), 7746-7786.

Park, et al., Oxygen electrocatalysts for water electrolyzers and reversible fuel cells: status and perspective. Energy Environ. Sci 2012, 5 (11), 9331-9344.

Chen, et al., Platinum-Based Nanostructured Materials: Synthesis, Properties, and Applications. Chem. Rev. 2010, 110 (6), 3767-3804.

Huang, et al., Systematic Control of Redox Properties and Oxygen Reduction Reactivity through Colloidal Ligand-Exchange Deposition of Pd on Au. Journal of the American Chemical Society 2018, 140 (28), 8918-8923.

Stamenkovic, et al., Improved Oxygen Reduction Activity on Pt(3)Ni(111) via Increased Surface Site Availability. Science 2007, 315 (5811), 493-497.

Bu, et al., Biaxially strained PtPb/Pt core/shell nanoplate boosts oxygen reduction catalysis. Science 2016, 354 (6318), 1410-1414.

Shao, et al., Recent Advances in Electrocatalysts for Oxygen Reduction Reaction. Chem. Rev. 2016, 116 (6), 3594-3657.

Li, et al., Ultrafine jagged platinum nanowires enable ultrahigh mass activity for the oxygen reduction reaction. Science 2016, 354 (6318), 1414-1419.

Wang, et al., Structurally ordered intermetallic platinum-cobalt core-shell nanoparticles with enhanced activity and stability as oxygen reduction electrocatalysts. Nat Mater 2013, 12 (1), 81-7.

Bu, et al., A General Method for Multimetallic Platinum Alloy Nanowires as Highly Active and Stable Oxygen Reduction Catalysts. Advanced Materials 2015, 27 (44), 7204-7212.

Du, et al., A Coverage-Dependent Study of Pt Spontaneously Deposited onto Au and Ru Surfaces: Direct Experimental Evidence of the Ensemble Effect for Methanol Electro-Oxidation on Pt. The Journal of Physical Chemistry B 2005, 109 (38), 17775-17780.

Bu, et al., Surface engineering of hierarchical platinum-cobalt nanowires for efficient electrocatalysis. Nature Communications 2016, 7, 11850.

Bu, et al., Coupled s-p-d Exchange in Facet-Controlled Pd(3)Pb Tripods Enhances Oxygen Reduction Catalysis. Chem 2018, 4 (2), 359-371.

Ghosh, et al., Pt—Cd and Pt—Hg Phases As High Activity Catalysts for Methanol and Formic Acid Oxidation. The Journal of Physical Chemistry C 2010, 114 (29), 12545-12553.

Higgins, et al., Copper Silver Thin Films with Metastable Miscibility for Oxygen Reduction Electrocatalysis in Alkaline Electro-lytes. ACS Applied Energy Materials 2018, 1 (5), 1990-1999.

Holewinski, et al., High-performance Ag—Co alloy catalysts for electrochemical oxygen reduction. Nature Chemistry 2014, 6, 828.

Li, et al., Oxygen Reduction Reaction on Classically Immiscible Bimetallics: A Case Study of RhAu. The Journal of Physical Chemistry C 2018, 122 (5), 2712-2716.

Kusada, et al., olid Solution Alloy Nanoparticles of Immiscible Pd and Ru Elements Neighboring on Rh: Changeover of the Thermodynamic Behavior for Hydrogen Storage and Enhanced CO-Oxidizing Ability. Journal of the American Chemical Society 2014, 136 (5), 1864-1871.

Piburn, et al., Rapid Synthesis of Rhodium-Palladium Alloy Nanocatalysts. ChemCatChem 2018, 10 (1), 329-333.

Maligal-Ganesh, et al., A Ship-in-a-Bottle Strategy To Synthesize Encapsulated Intermetallic Nanoparticle Catalysts: Exemplified for Furfural Hydrogenation. ACS Catalysis 2016, 6 (3), 1754-1763.

Chen, et al., A Surfactant-Free Strategy for Synthesizing and Processing Intermetallic Platinum-Based Nanoparticle Catalysts. Journal of the American Chemical Society 2012, 134 (44), 18453-18459.

Ji, et al., Nanocrystalline intermetallics on mesoporous carbon for direct formic acid fuel cell anodes. Nature Chemistry 2010, 2, 286.

Xiong, et al., Revealing the atomic ordering of binary intermetallics using in situ heating techniques at multilength scales. Proceedings of the National Academy of Sciences 2019, 116 (6), 1974-1983.

Vasquez, et al., Low-Temperature Solution Synthesis of the Non-Equilibrium Ordered Intermetallic Compounds Au3Fe, Au3Co, and Au3Ni as Nanocrystals. Journal of the American Chemical Society 2008, 130 (36), 11866-11867.

Yan, et al., Intermetallic Nanocrystals: Syntheses and Catalytic Applications. Advanced Materials 2017, 29 (14), 1605997.

Wang, et al., Size-Dependent Disorder-Order Transformation in the Synthesis of Monodisperse Intermetallic PdCu Nanocatalysts. ACS Nano 2016, 10 (6), 6345-6353.

Essinger-Hileman, et al., Aqueous room-temperature synthesis of Au—Rh, Au—Pt, Pt—Rh, and Pd—Rh alloy nanoparticles: fully tunable compositions within the miscibility gaps. Journal of Materials Chemistry 2011, 21 (31), 11599-11604.

Kusada, et al., Hydrogen-Storage Properties of Solid-Solution Alloys of Immiscible Neighboring Elements with Pd. Journal of the American Chemical Society 2010, 132 (45), 15896-15898.

Marbella, et al., Gold-Cobalt Nanoparticle Alloys Exhibiting Tunable Compositions, Near-Infrared Emission, and High T2 Relaxivity. Advanced Functional Materials 2014, 24 (41), 6532-6539.

Kang, et al., Synthesis, Shape Control, and Methanol Electro-oxidation Properties of Pt—Zn Alloy and Pt3Zn Intermetallic Nanocrystals. ACS Nano 2012, 6 (6), 5642-5647.

Rodrigues Da Silva, et al., Synthesis and Characterization of Ordered Intermetallic Nanostructured PtSn/C and PtSb/C and Evaluation as Electrodes for Alcohol Oxidation. Electrocatalysis 2010, 1 (2), 95-103.

Liao, et al., Synthesis and electrocatalytic properties of PtBi nanoplatelets and PdBi nanowires. Nanoscale 2014, 6 (2), 1049-1055.

Dinega, et al., A Solution-Phase Chemical Approach to a New Crystal Structure of Cobalt. Angewandte Chemie International Edition 1999, 38 (12), 1788-1791.

Kusada, et al., Discovery of Face-Centered-Cubic Ruthenium Nanoparticles: Facile Size-Controlled Synthesis Using the Chemical Reduction Method. Journal of the American Chemical Society 2013, 135 (15), 5493-5496.

Parija, et al., Traversing Energy Landscapes Away from Equilibrium: Strategies for Accessing and Utilizing Metastable Phase Space. The Journal of Physical Chemistry C 2018, 122 (45), 25709-25728.

Zangari, Electrodeposition of Alloys and Compounds in the Era of Microelectronics and Energy Conversion Technology. Coatings 2015, 5 (2), 195-218.

Hwang, et al., Electrodeposition of Pt100—xPbx Metastable Alloys and Intermetallics. Journal of The Electrochemical Society 2011, 158 (6), D307-D316.

Wang, et al., Rapid Room-Temperature Synthesis of a Metastable Ordered Intermetallic Electrocatalyst. Journal of the American Chemical Society 2019, 141 (6), 2342-2347.

(56) References Cited

OTHER PUBLICATIONS

Asset, et al., Porous Hollow PtNi/C Electrocatalysts: Carbon Support Considerations To Meet Performance and Stability Requirements. ACS Catalysis 2017, 893-903.

Masa, et al., Koutecky-Levich analysis applied to nanoparticle modified rotating disk electrodes: Electrocatalysis or misinterpretation. Nano Research 2014, 7 (1), 71-78.

Lee, et al., Impact of Pulse Parameters on Current Distribution in High Aspect Ratio Vias and Through-Holes. Journal of The Electrochemical Society 2005, 152 (10), C645.

Cherkasov N. et al., Palladium inter metallic and surface-poisoned catalysts for the semi-hydrogenation of 2-methyl-3-butyn-2-ol, Applied Catalysis A: General 2015, vol. 497, pp. 22-30.

* cited by examiner

PULSED ELECTROCHEMICAL DEPOSITION OF ORDERED INTERMETALLIC CARBON COMPOSITES

CROSS-REFERENCE TO RELATED APPLICATIONS

This application is a 35 U.S.C. § 371 U.S. national entry of International Application PCT/US2020/061806, having an international filing date of Nov. 23, 2020, which claims the benefit of U.S. Provisional Application No. 62/939,257, filed Nov. 22, 2019, the content of each of the aforementioned applications is herein incorporated by reference in their entirety.

GOVERNMENT SUPPORT

This invention was made with government support under CHE-1764310 awarded by the National Science Foundation. The government has certain rights in the invention.

FIELD OF THE INVENTION

The present invention relates generally to coatings. More particularly, the present invention relates to pulsed electrochemical deposition of ordered intermetallic carbon composites for advanced electrocatalytic applications.

BACKGROUND OF THE INVENTION

Metastable materials offer the opportunity to explore new materials for electrocatalysis beyond conventional equilibrium phases. Metastable ordered intermetallic compounds (metastable alloys with long range atomic scale ordering) offer unparalleled control of material properties by providing the ability to precisely modulate the local atomic structure by accessing a specific phase, and allowing one to access various structural variations of materials with the same composition. However, synthetic methods for manipulating the nanoscale morphology of metastable ordered intermetallic compounds is difficult, since the principles which govern formation of these materials is poorly understood. Catalyst activity and selectivity are impacted by the atomic structure and morphology of the electrode. Hence, lack of morphological control of metastable ordered intermetallic materials is hampering its progress for advancing the field of electrocatalysis.

Nanostructured metastable ordered intermetallic compounds are difficult to rationally target synthetically because the nucleation and growth conditions required to access these phases are not unequivocally known. The formation of metastable ordered intermetallic nanoparticles can only occur under conditions in which interfacial stabilization by capping agents results in greater stability for the metastable phase relative to equilibrium phases, or under conditions in which nucleation rather solid-state diffusion is rate limiting. However, the former case is difficult to predict from first principles, while the latter often results in materials with poor atomic ordering. Hence, conventional synthetic methods, such as high temperature annealing and/or colloidal synthesis, largely excludes the formation of metastable ordered intermetallic compounds under typical reaction conditions.

Electrochemical deposition has recently emerged as a flexible technique for the direct preparation of metastable alloys and ordered intermetallic phases yielding catalyst with high intrinsic catalytic performance. However, these techniques are limited to the preparation of thin films on flat/nonporous substrates, precluding their application in an application-relevant contexts which require high surface area, and for designing materials which can harness diffusional transport gradients for enhancing catalytic activity and/or selectivity.

Accordingly, there is a need in the art for a method utilizing pulsed electrochemical deposition to decouple nucleation from growth kinetics, allowing for the direct synthesis of sub-15 nm diameter metastable ordered intermetallic $Pd_{31}Bi_{12}$ nanoparticles which uniformly decorate commercial carbon black supports.

SUMMARY OF THE INVENTION

The foregoing needs are met, to a great extent, by the present invention which includes a method of forming a nanostructured metastable ordered intermetallic compound including depositing $Pd_{31}Bi_{12}$ nanoparticles using pulsed electrochemical deposition.

In accordance with a method of the present invention, the $Pd_{31}Bi_{12}$ nanoparticles are deposited at room temperature and atmospheric pressure. The $Pd_{31}Bi_{12}$ nanoparticles are deposited on high surface area carbon supports. Nucleation is decoupled from growth. The $Pd_{31}Bi_{12}$ nanoparticles are deposited in a single step. The open circuit potential is typically 0.54 V. A pulsed potentiostatic waveform with a large overpotential to initiate uniform nucleation is used. The pulsed potentiostatic waveform can take the form a pulse of t=0.03+5 s for 200 cycles. The pulsed potentiostatic waveform with the large overpotential to initiate uniform nucleation is used with a constant potential deposition to grow deposited nuclei. The constant potential deposition has a duration of t=180 s. The method includes depositing the $Pd_{31}Bi_{12}$ nanoparticles at atmospheric pressure.

In accordance with another aspect of the present invention, a structural base and deposited material includes high surface area carbon supports. The material also includes $Pd_{31}Bi_{12}$ nanoparticles deposited on the high surface area carbon supports with pulsed electrochemical deposition.

In accordance with yet another aspect of the present invention, the $Pd_{31}Bi_{12}$ nanoparticles are smaller than 15 nm. The $Pd_{31}Bi_{12}$ nanoparticles display a 7× enhancement of mass activity relative to Pt/C. The $Pd_{31}Bi_{12}$ nanoparticles display a 4× enhancement for the oxygen reduction reaction (ORR) relative to Pd/C. An isolation of Pd sites from one another facilitate methanol tolerant oxygen reduction reaction (ORR) behavior. The $Pd_{31}Bi_{12}$ nanoparticles are dispersed uniformly on the high surface area carbon supports. The $Pd_{31}Bi_{12}$ nanoparticles are single crystalline. The $Pd_{31}Bi_{12}$ of the $Pd_{31}Bi_{12}$ nanoparticles is a metastable phase. The $Pd_{31}Bi_{12}$ nanoparticles can be accessed at room temperature.

BRIEF DESCRIPTION OF THE DRAWINGS

The accompanying drawings provide visual representations, which will be used to more fully describe the representative embodiments disclosed herein and can be used by those skilled in the art to better understand them and their inherent advantages. In these drawings, like reference numerals identify corresponding elements and.

DETAILED DESCRIPTION

Figure 1:
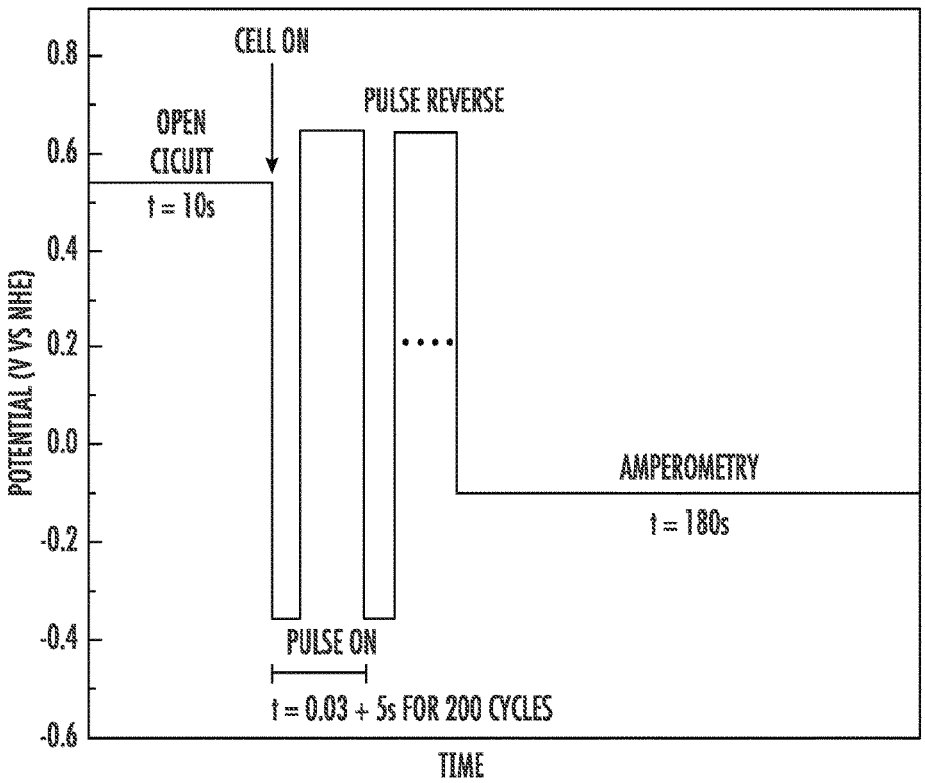
FIG. 1 illustrates the potentiostatic waveforms used to deposit $Pd_{31}Bi_{12}$. The open circuit potential is typically ~0.54V.

The presently disclosed subject matter now will be described more fully hereinafter with reference to the accompanying Drawings, in which some, but not all embodiments of the inventions are shown. Like numbers refer to like elements throughout. The presently disclosed subject matter may be embodied in many different forms and should not be construed as limited to the embodiments set forth herein; rather, these embodiments are provided so that this disclosure will satisfy applicable legal requirements. Indeed, many modifications and other embodiments of the presently disclosed subject matter set forth herein will come to mind to one skilled in the art to which the presently disclosed subject matter pertains having the benefit of the teachings presented in the foregoing descriptions and the associated Drawings. Therefore, it is to be understood that the presently disclosed subject matter is not to be limited to the specific embodiments disclosed and that modifications and other embodiments are intended to be included within the scope of the appended claims.

Metastable alloys have recently emerged as high-performance catalysts, extending the toolbox of binary alloy materials that can be utilized to mediate electrocatalytic reactions. In particular, nanostructured metastable ordered intermetallic compounds are particularly challenging to synthesize. Here, the present invention is directed to a method for synthesizing sub-15 nm metastable ordered intermetallic $Pd_{31}Bi_{12}$ nanoparticles at room temperature, in a single step, by pulsed electrochemical deposition onto high surface area carbon supports. The resulting $Pd_{31}Bi_{12}$ nanoparticles displays a 7× enhancement of the mass activity relative to Pt/C and a 4× enhancement relative to Pd/C for the oxygen reduction reaction (ORR). The high performance of $Pd_{31}Bi_{12}$ nanoparticles is demonstrated to arise from reduced oxygen binding caused by alloying of Pd with Bi. The isolation of Pd-sites from each other facilitate methanol tolerant ORR behavior.

The present invention is directed to a method utilizing pulsed electrochemical deposition to decouple nucleation from growth kinetics, allowing for the direct synthesis of sub-15 nm diameter metastable ordered intermetallic $Pd_{31}Bi_{12}$ nanoparticles which uniformly decorate commercial carbon black supports. Pulsed electrochemical deposition allows us access to a non-equilibrium synthetic environment, promoting the synthesis of metastable ordered intermetallic nanoparticles. The resulting $Pd_{31}Bi_{12}$ nanoparticles achieve a surface area of ~37 $m^2/g_{Pd}$, which is nearly 40× higher than conventional electrodeposition processes which yield low-porosity thin film morphologies. This is the first report of metastable ordered intermetallic nanoparticles dispersed onto carbon supports prepared by electrochemical deposition at room temperature and atmospheric pressure. Finely dispersed $Pd_{31}Bi_{12}$ nanoparticles on carbon supports exhibit high mass activities for the oxygen reduction reaction and methanol tolerant oxygen reduction electrocatalysis.

To achieve isolated nanoparticles of metastable $Pd_{31}Bi_{12}$, high surface area carbon, Vulcan XC-72 (The Fuel Cell Store) was used as the support. A pulsed potentiostatic waveform was used at a large overpotential to initiate nucleation uniformly over the surface of the high surface area carbon, followed by constant potential deposition to grow the deposited nuclei, as illustrated in FIG. 1. FIG. 1 illustrates the potentiostatic waveforms used to deposit $Pd_{31}Bi_{12}$. The open circuit potential is typically ~0.54V. Voltages are shown vs the Normal Hydrogen Electrode (NHE). The pulse duration for nucleation formation is, in a preferred embodiment, t=0.03+5 s for 200 cycles. This can be varied as would be known to one of skill in the art. The pulsed potentiostatic waveform is followed by constant potential deposition at a duration of 180 s, in a preferred embodiment. This can also be varied as would be known to one of skill in the art.

Figure 2A:
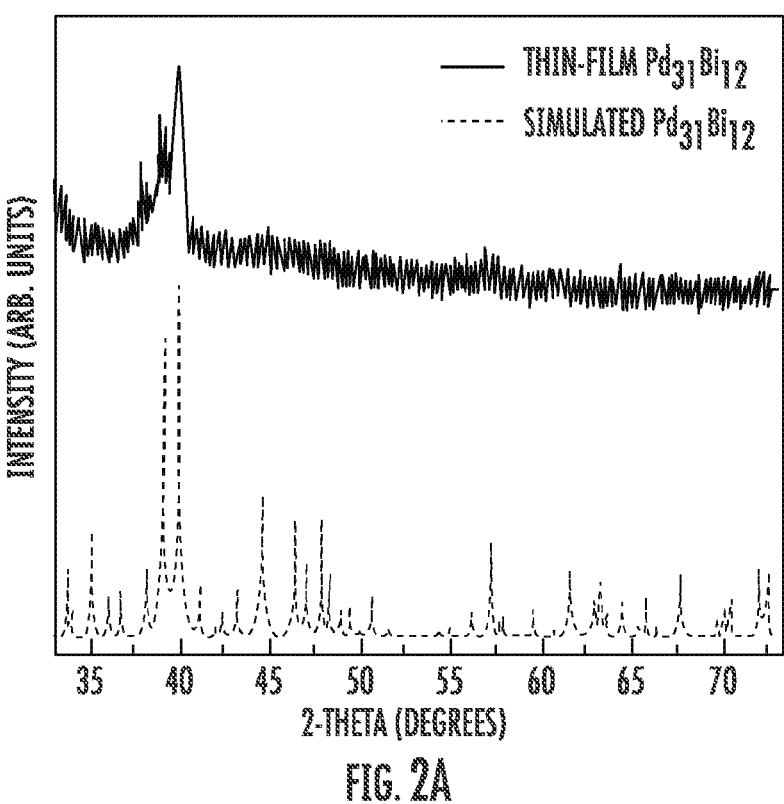
FIGS. 2A-2D illustrate graphical and image views of nanoparticles according to an embodiment of the present invention.
Figure 2B:
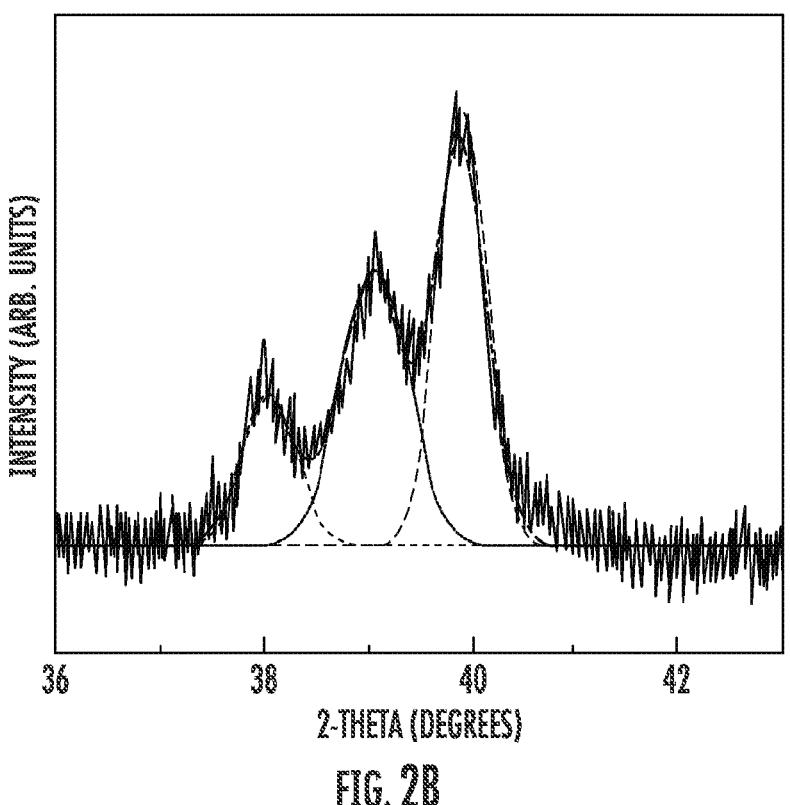
Figure 2C:
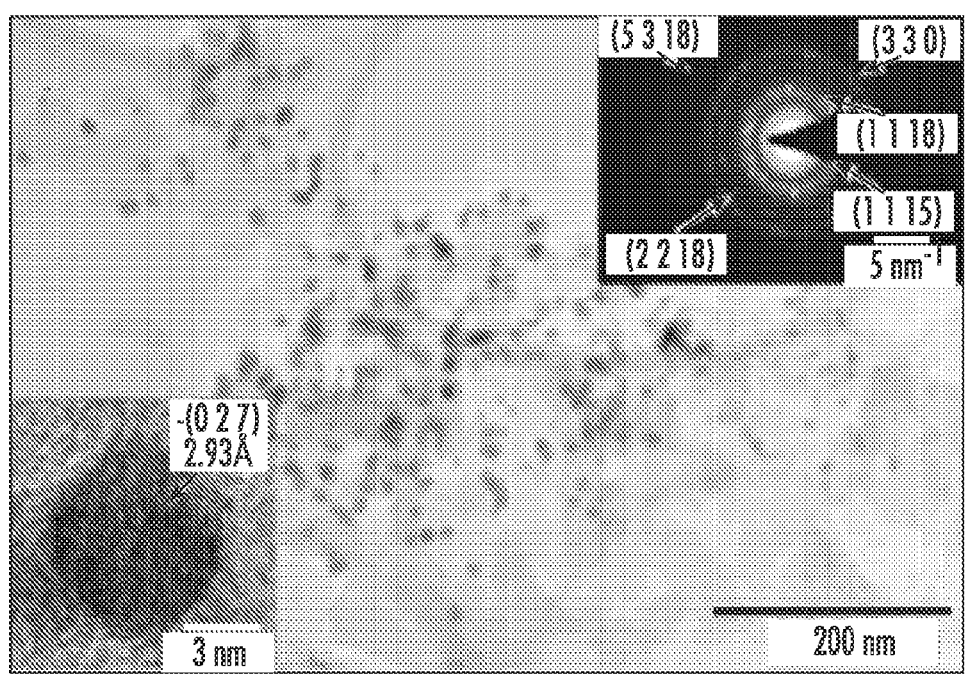
Figure 2D:
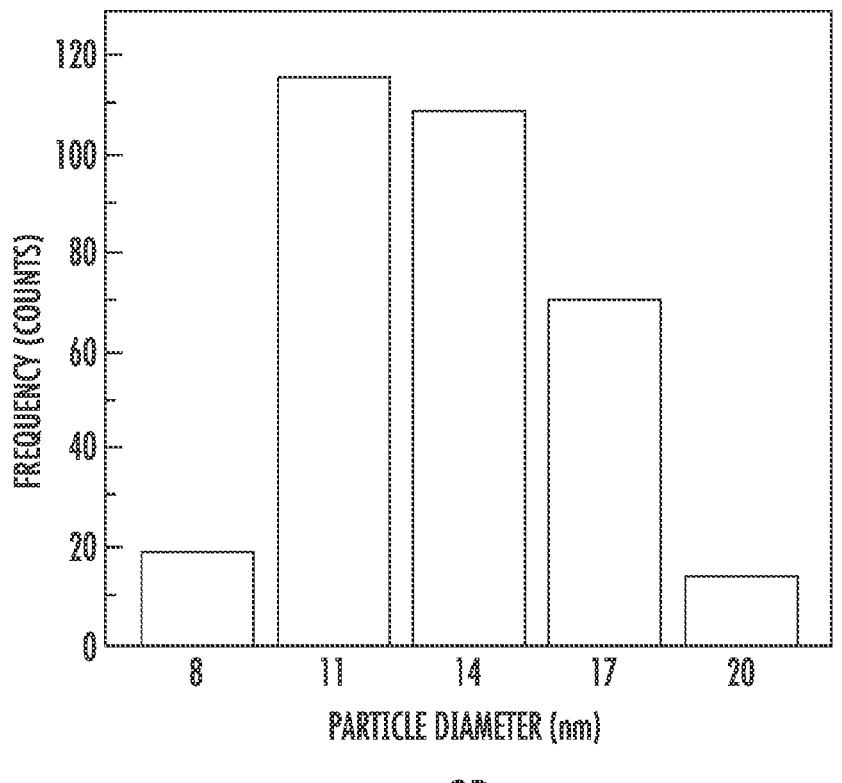

FIGS. 2A-2D illustrate graphical and image views of nanoparticles according to an embodiment of the present invention. FIG. 2A illustrates an XRD of electrodeposited $Pd_{31}Bi_{12}$ nanoparticles. FIG. 2B illustrates a zoom-in with peak fitting of the 3 primary reflections, the Scherrer equation was used to calculate the grain size from the deconvolved peak at 390 from the (1 1 15) plane. FIG. 2C illustrates a representative transmission electron microscopy (TEM) image of the electrodeposited nanoparticles and the corresponding selected area electron diffraction (SAED) pattern which matches $Pd_{31}Bi_{12}$. FIG. 2D illustrates a particle size histogram of $Pd_{31}Bi_{12}$ nanoparticles, the average particle size is 13 nm. The simulated $Pd_{31}Bi_{12}$ diffraction patterns are from ICSD coll. To identify the crystal structure of the as deposited sample, powder X-ray diffraction (XRD) patterns were obtained by scratching off the film onto double sided kapton tape, as illustrated in FIG. 2A. The primary peaks obtained in the diffractogram match the simulated $Pd_{31}Bi_{12}$ pattern, indicating that phase pure $Pd_{31}Bi_{12}$ was formed. The primary reflections of the deposited $Pd_{31}Bi_{12}$ are broad, and Scherrer analysis of the (1 1 15) reflection indicates the average grain size of the $Pd_{31}Bi_{12}$ is ~15 nm, as illustrated in FIG. 2B. Images collected by transmission electron microscopy (TEM) indicate that $Pd_{31}Bi_{12}$ are dispersed uniformly on carbon, the average particle size estimated by TEM is ~13 nm, which agrees with the value estimated by the Scherrer analysis, as illustrated in FIGS. 2B-2D. High-resolution TEM image of a $Pd_{31}Bi_{12}$ particle indicate the particles are single crystalline, with an observed lattice spacing of ~2.93 Å, which can be indexed to the (0 2 7) plane. The rings from the Selected Area Electron Diffraction (SAED) image from the same region in FIG. 2C can be indexed to the (1 1 15), (1 1 18), (3 3 0) and (2 2 18), and (5 3 18) reflections of $Pd_{31}Bi_{12}$. It is worth noting that $Pd_{31}Bi_{12}$ is a metastable phase, as the phase diagram indicates it is stable between 500° C. to 600° C. Remarkably, nanoparticles of this material can be accessed at room temperature in minutes, while the preparation of metastable stable phases by other methods is not straightforward.

Figure 3A:
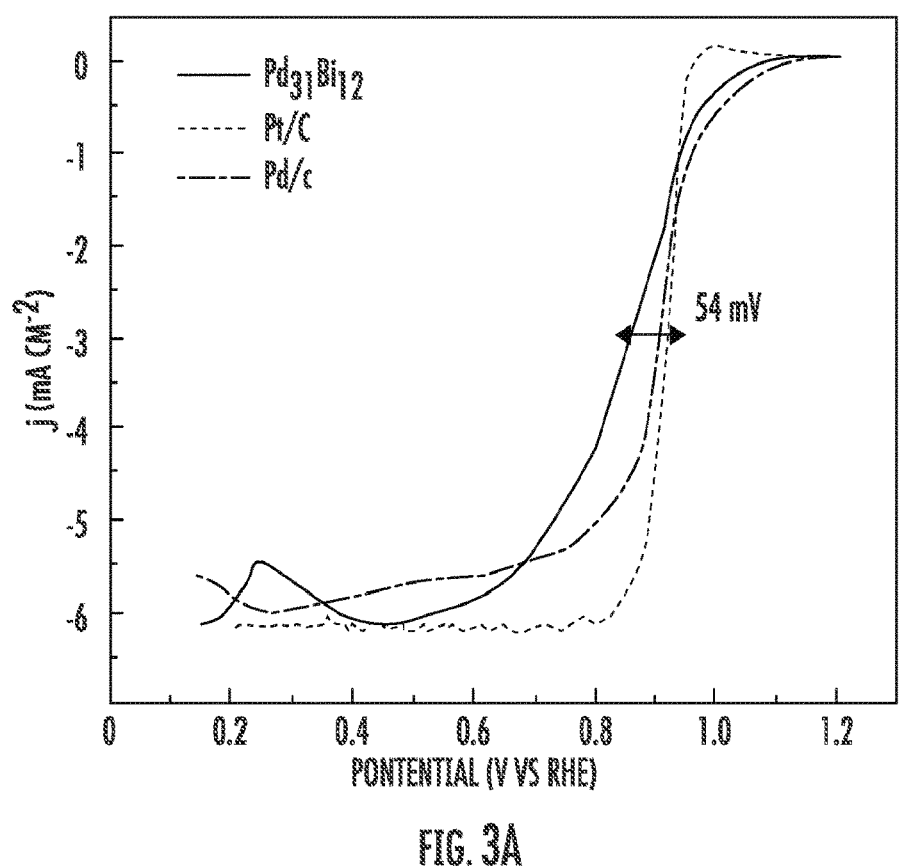
FIGS. 3A-3D illustrate graphical views for testing of the deposited nanoparticles according to the present invention.
Figure 3B:
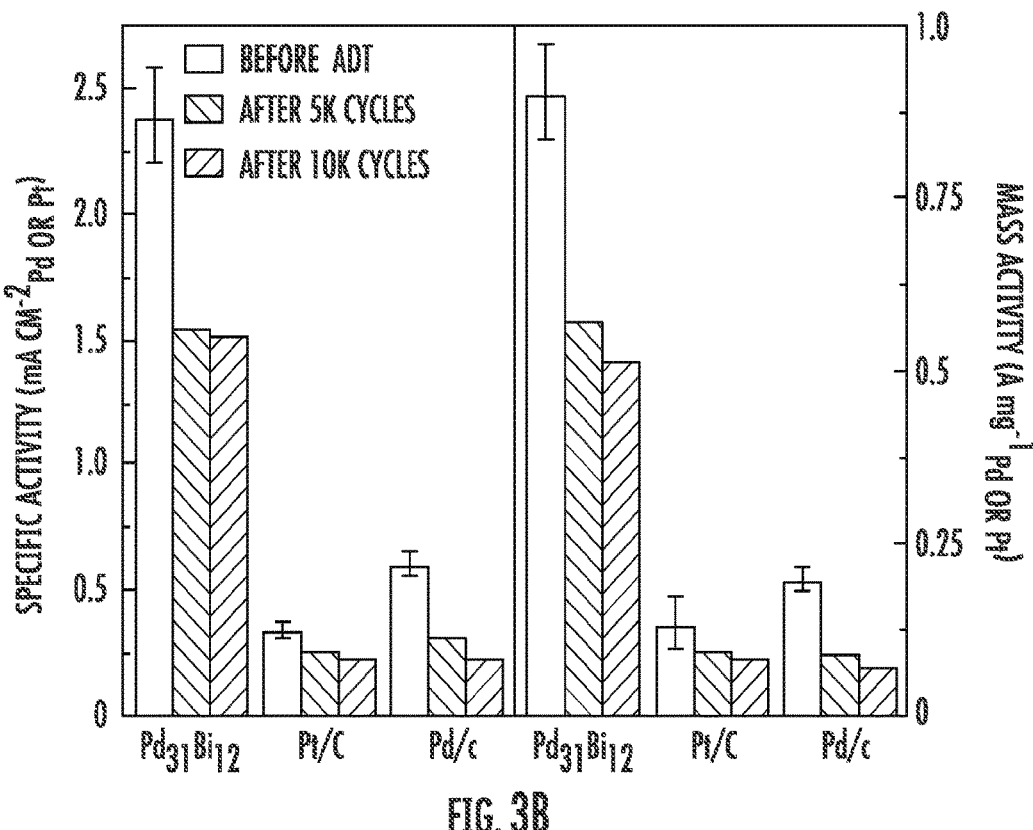
Figure 3C:
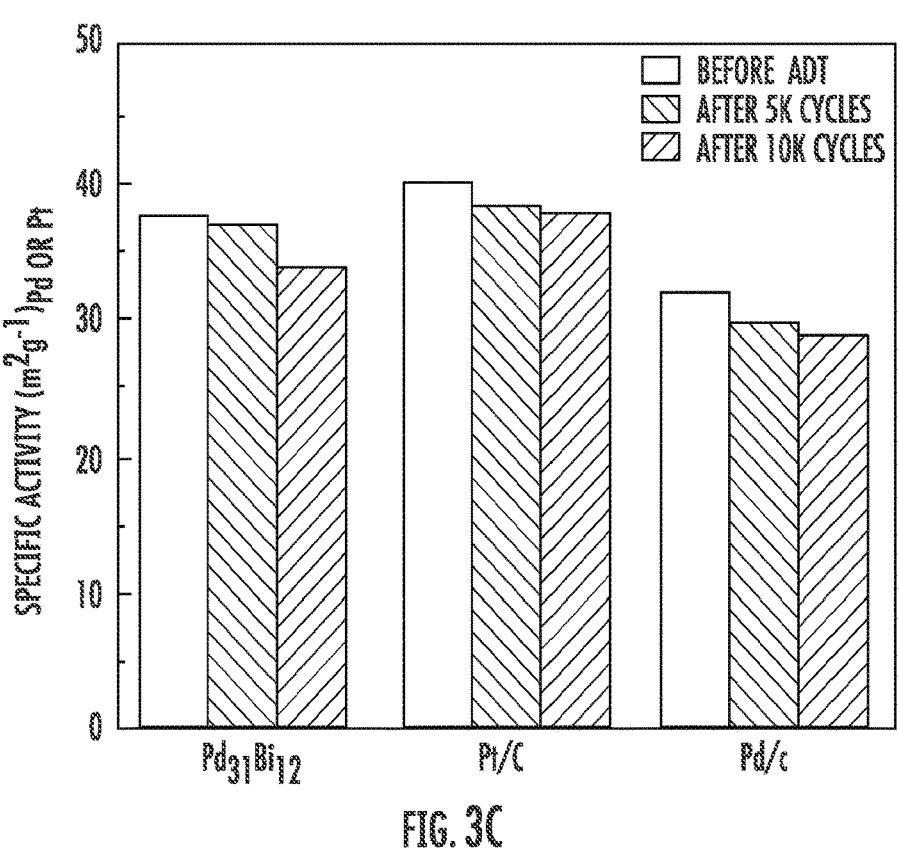
Figure 3D:
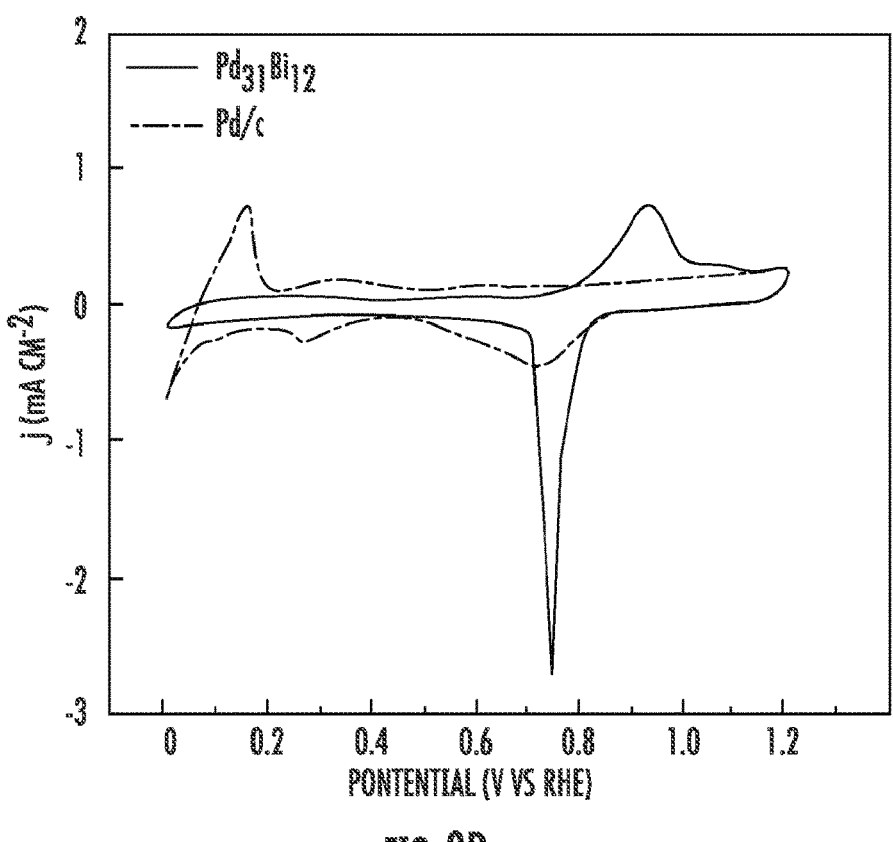

FIGS. 3A-3D illustrate graphical views for testing of the deposited nanoparticles according to the present invention. FIG. 3A illustrates a graphical view of linear sweep voltammograms (LSV) of catalysts collected at 1600 rpm. FIG. 3B illustrates a graphical view of mass transport corrected specific activity at 0.90 V vs Reversible Hydrogen Electrode (RHE) for fresh samples and samples subjected to 5K and 10K accelerated durability testing. FIG. 3C illustrates a graphical view of specific surface areas for fresh and samples subjected to 5K and 10K accelerated durability testing. All ORR measurements were performed in O2-saturated 0.1 KOH electrolyte with a catalyst loading of ~24 $\mu g/cm^2$ on a precious metal basis. FIG. 3D illustrates a cyclic voltammogram of $Pd_{31}Bi_{12}$/C and Pd/C in N2-saturated 0.1 M KOH.

Figure 5:
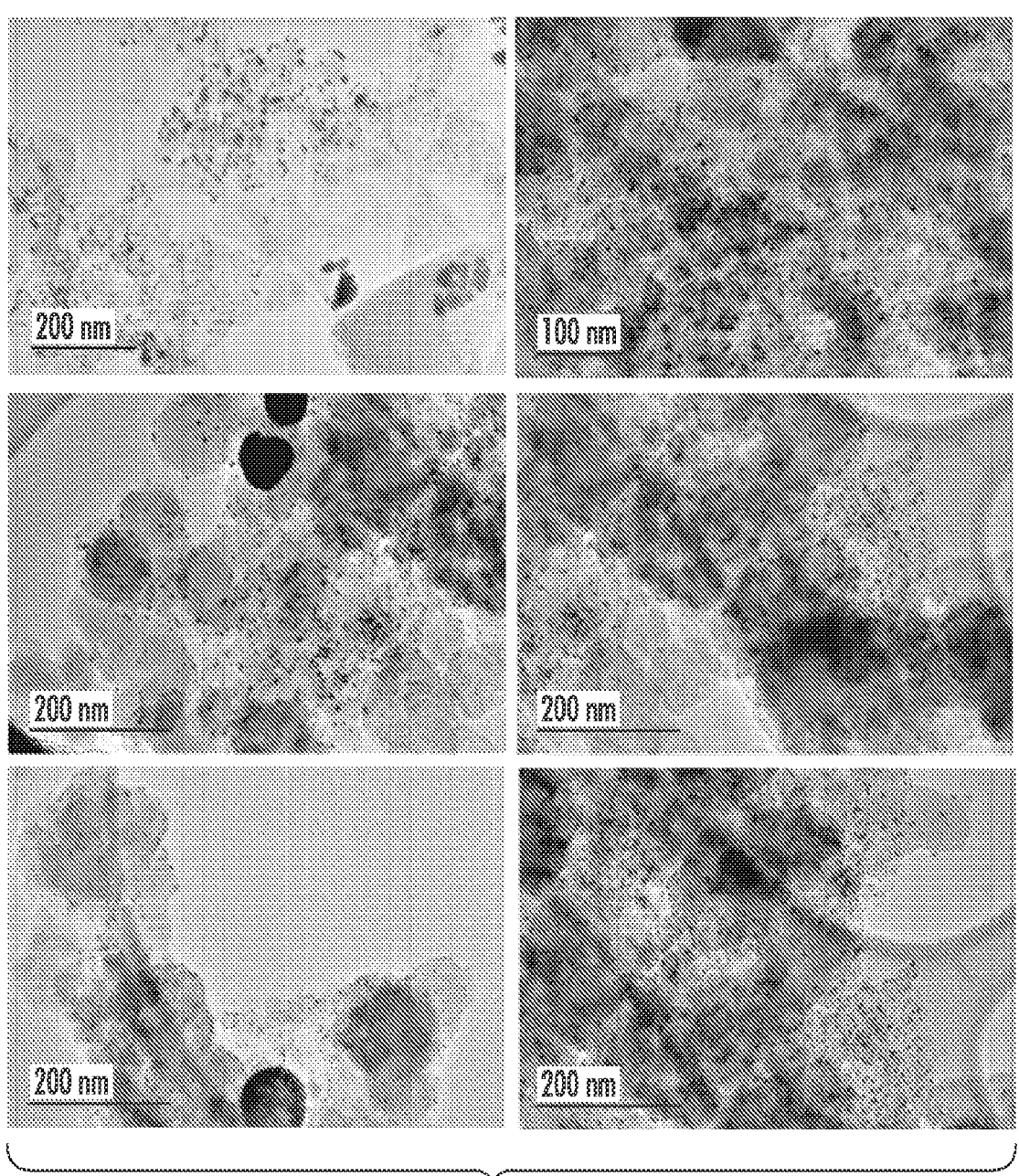
FIG. 5 illustrates image views of representative TEM images of $Pd_{31}Bi_{12}$ nanoparticles decorating carbon.

The electrochemical performance of the $Pd_{31}Bi_{12}$ supported on carbon is explored, henceforth denoted as $Pd_{31}Bi_{12}$/C, for ORR and compared to commercial Pd/C (Premetek) and Pt/C (TKK). The ORR performance was assessed by measuring Linear Sweep Voltammograms (LSV) on $Pd_{31}Bi_{12}$/C, Pd/C, Pt/C in 0.1M KOH electrolyte saturated with oxygen at 1600 rpm, as illustrated in FIG. 3A. The onset potential for ORR with $Pd_{31}Bi_{12}$/C (0.97 V) is lower than Pt/C (1.03 V) and Pd/C (1.09 V). However, as the overpotential for ORR increases, the current density of $Pd_{31}Bi_{12}$ increases faster than that of Pt/C and Pd/C, resulting in a higher current density after 0.94V. The half-wave potential of $Pd_{31}Bi_{12}$/C is 0.92V, whereas the half-wave potential of Pt/C and Pd/C is 0.87V and 0.91V, respectively. The intrinsic activity of all materials was determined by mass-transport correction of linear sweep voltammograms by the Koutecky-Levich equation to obtain the kinetic current density, which was then normalized by the electrochemically active surface area (specific activity) or mass of precious metal (mass activity). The mass and electrochemically active surface areas were measured by Inductively Coupled Plasma Mass Spectrometry (ICP-MS) and CO stripping, respectively. At 0.90V, the activities of $Pd_{31}Bi_{12}$/C (2.42±0.20 mA/cm²Pd, 0.95±0.18 A/m $g_{Pd}$) are significantly higher than that of Pt/C (0.32±0.20 mA/cm²Pt, 0.13±0.04 A/mg$_{Pt}$) and Pd/C (0.62±0.04 mA/cm²$_{Pd}$, 0.20±0.02 A/mg$_{Pd}$). The specific and mass activities of electrodeposited Pt/C and Pd/C was also measured and found to be comparable to commercial Pt/C and Pd/C samples, as illustrated in FIG. 5. FIG. 5 illustrates image views of representative TEM images of $Pd_{31}Bi_{12}$ nanoparticles decorating carbon.

The ~4-fold enhancement of activity, compared to Pd/C, and ~7-fold enhancement of activity relative to Pt/C indicate that $Pd_{31}Bi_{12}$/C exhibits excellent performance for ORR.

Figure 6:
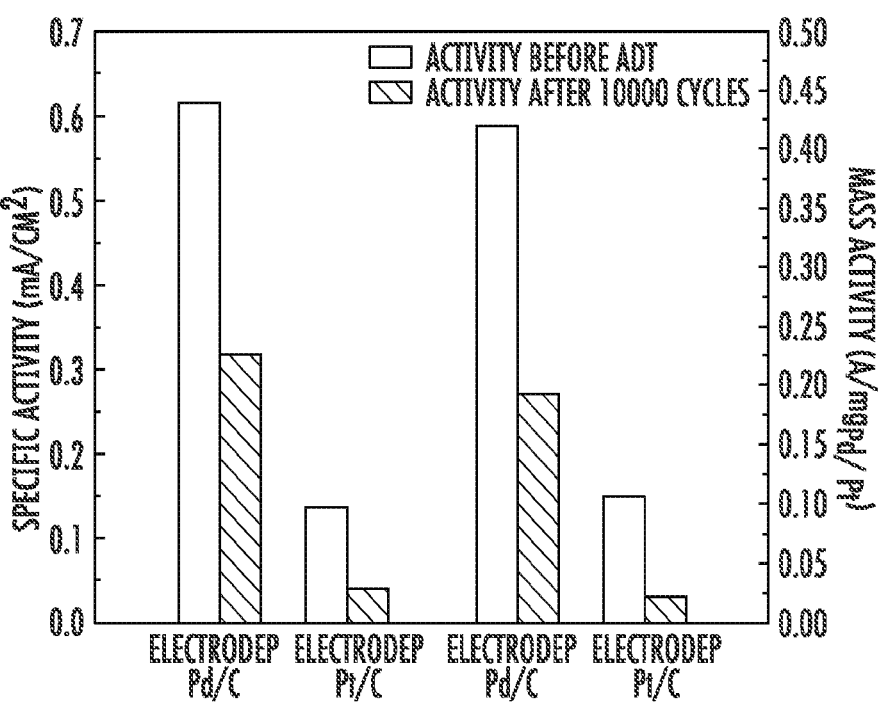
FIG. 6 illustrates a graphical view of mass transport corrected specific activity and mass activity of Pt/C and Pd/C at 0.90 V vs Real Hydrogen Electrode (RHE) for fresh samples and samples subjected 10K of accelerated durability testing.
Figure 7:
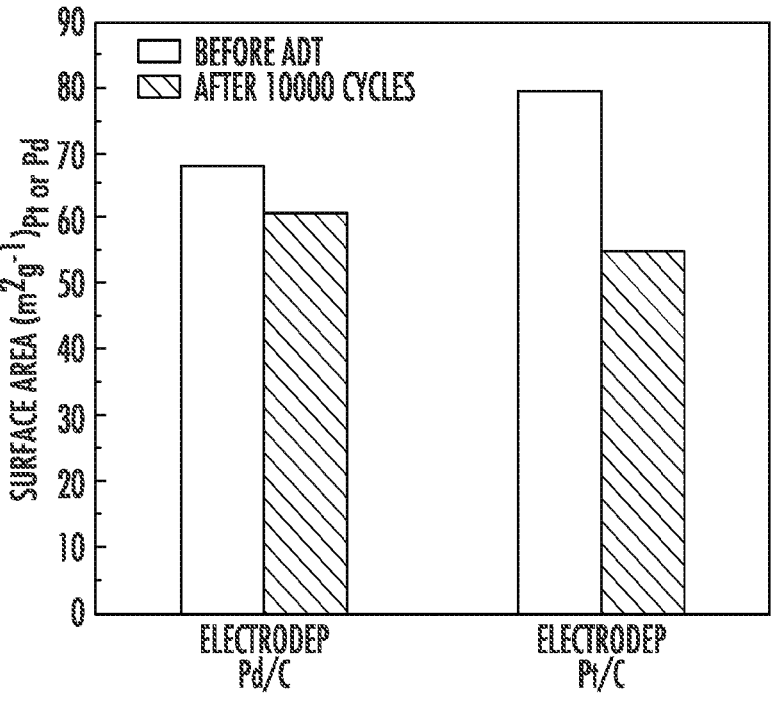
FIG. 7 illustrates a graphical view of specific surface areas for fresh electrodeposited Pd/C and Pt/C and samples subjected to 10K accelerated durability testing.

The stability of the materials was assessed by performing accelerated durability testing (ADT), by sweeping the voltage repeatedly between 0.6 and 1.0V at 100 mV/s scan rate in O2 saturated 0.1 M KOH to simulate long-term fuel cell operation. The specific and mass activity of $Pd_{31}Bi_{12}$ decreases from 2.42 to 1.35 mA/cm²Pd, and 0.95 to 0.54 A/mg$_{Pd}$, after 10,000 cycle indicating a retention of ~ 60% of the initial activity, as illustrated in FIG. 3B. The activity retention after 10,000 cycles of ADT for Pt/C was ~70% for both the mass and specific activity, which is comparable to $Pd_{31}Bi_{12}$. However, the specific activity retention of Pd/C is ~30%, indicating that it exhibits significantly lower stability than $Pd_{31}Bi_{12}$/C. The specific surface areas $Pd_{31}Bi_{12}$ and Pt/C decreases by ~10%, and by ~15% for Pd/C after 10K cycles, the loss of activity is probably caused by particle aggregation, and removal of highly active sites via surface reconstructions, as illustrated in FIG. 3C. The stability of electrodeposited Pd/C and Pt/C samples was comparable to commercial Pt/C and Pd/C samples, indicating that electrodeposition does not enhance the intrinsic interaction of the material with the carbon support, as illustrated in FIGS. 5 and 6. FIG. 6 illustrates a graphical view of mass transport corrected specific activity and mass activity of Pt/C and Pd/C at 0.90 V vs RHE for fresh samples and samples subjected 10K of accelerated durability testing. All ORR measurements were performed in O2-saturated 0.1 KOH electrolyte. High-resolution TEM after ADT indicates that the intermetallic crystallinity of $Pd_{31}Bi_{12}$ is retained, as illustrated in FIG. 7. FIG. 7 illustrates a graphical view of specific surface areas for fresh electrodeposited Pd/C and Pt/C and samples subjected to 10K accelerated durability testing. All ORR measurements were performed in O2-saturated 0.1 KOH electrolyte. $Pd_{31}Bi_{12}$ displays significantly higher stability than Pd/C and comparable stability to Pt/C, while maintaining activities≥0.5 mA/mg$_{Pd}$ and 1.5 mA/cm²$_{Pd}$. The enhanced stability of $Pd_{31}Bi_{12}$ relative to Pd/C can be attributed to the strong bonds afforded by the negative enthalpy of mixing of Pd and Bi and/or by enhanced affinity of $Pd_{31}Bi_{12}$ with the carbon support.

Figure 8:
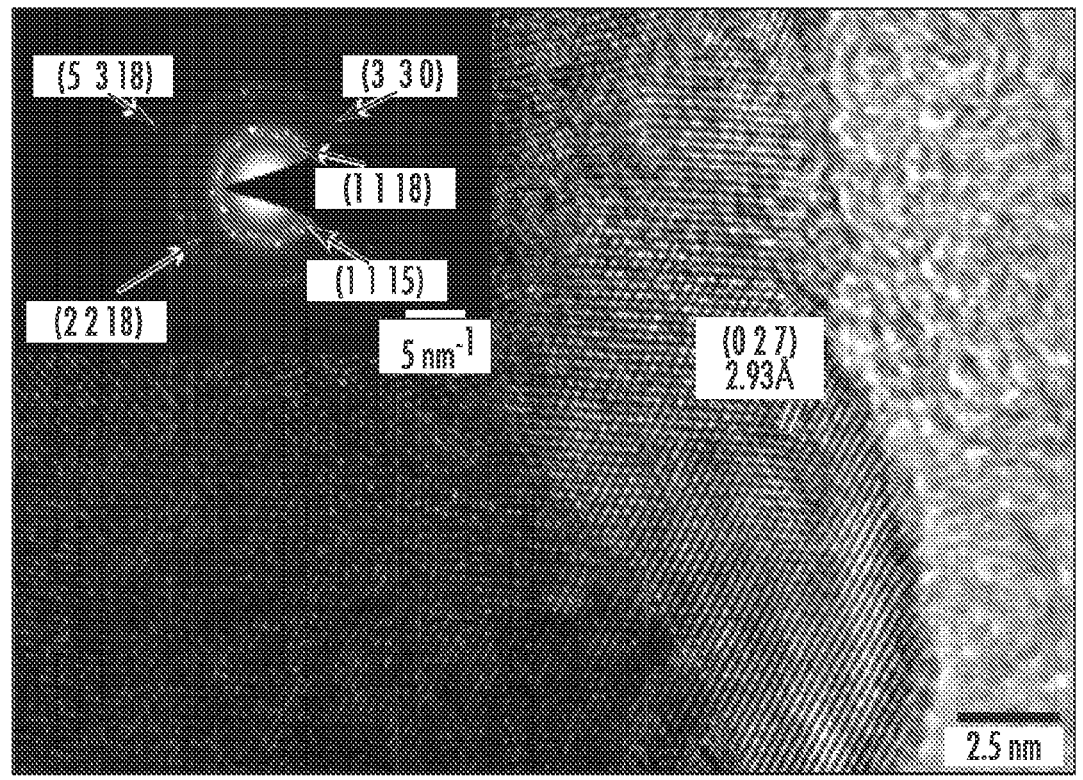
FIG. 8 illustrates an image view of a representative high resolution TEM image of $Pd_{31}Bi_{12}$ and its resulting electron diffraction pattern after 10K cycles of ADT demonstrating a retainment of intermetallic crystallinity.

To understand why $Pd_{31}Bi_{12}$/C is more active than elemental Pd/C cyclic voltammograms of both samples in N2-saturated 0.1 M KOH were measure as illustrated in FIG. 3D. $Pd_{31}Bi_{12}$/C does not exhibit hydrogen underpotential deposition (H-UPD) in the potential range 0 to ~0.4 V potential range, while it is clearly visible on Pd/C. The surface oxidation feature of $Pd_{31}Bi_{12}$/C which occurs above 0.7V in the anodic scan displays a sharper feature relative to Pd/C. In the reverse scan direction (anodic scan) of the cyclic voltammogram, the Pd oxide reduction peak of $Pd_{31}Bi_{12}$/C is significantly sharper than Pd/C. In addition to this the Pd oxide reduction peak of $Pd_{31}Bi_{12}$/C (0.750 V) shifts by 31 mV towards more positive potentials relative to Pd/C (0.719 V), indicating that the Pd—O bond has substantially weakened. Pd adsorbs oxygen based intermediates too strongly, hence a reduction of the Pd—O bond energy can enhance catalysis as indicated by the Sabatier principle. FIG. 8 illustrates an image view of a representative high resolution TEM image of $Pd_{31}Bi_{12}$ and its resulting electron diffraction pattern after 10K cycles of ADT demonstrating a retainment of intermetallic crystallinity.

Figure 4A:
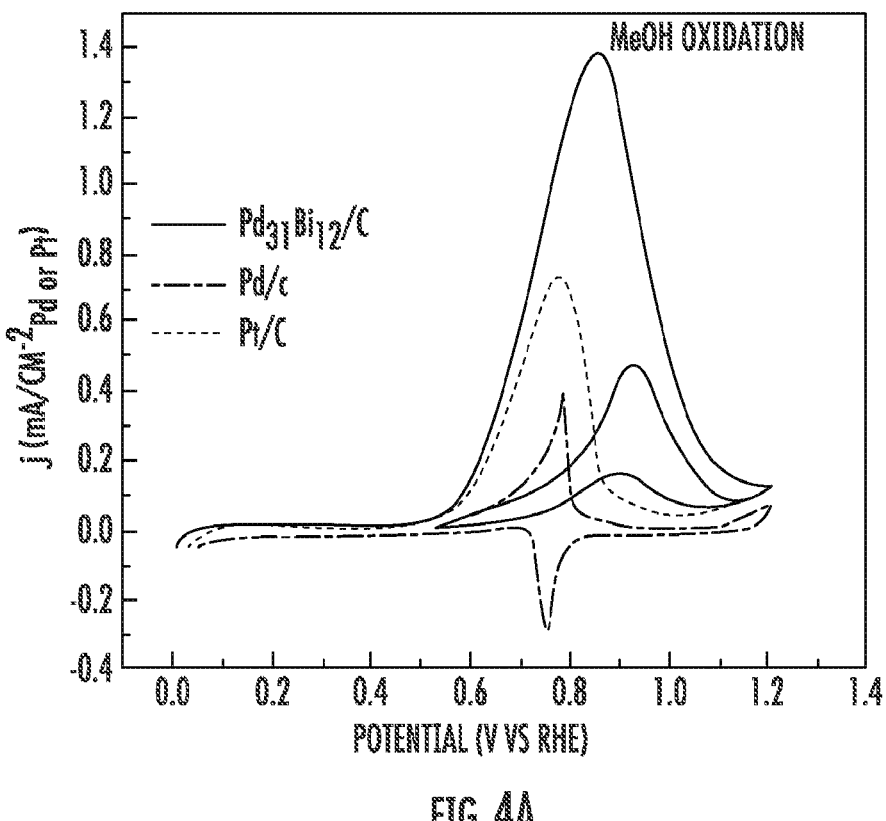
FIGS. 4A-4C illustrate graphical views of sample characteristics, according to an embodiment of the present invention.
Figure 4B:
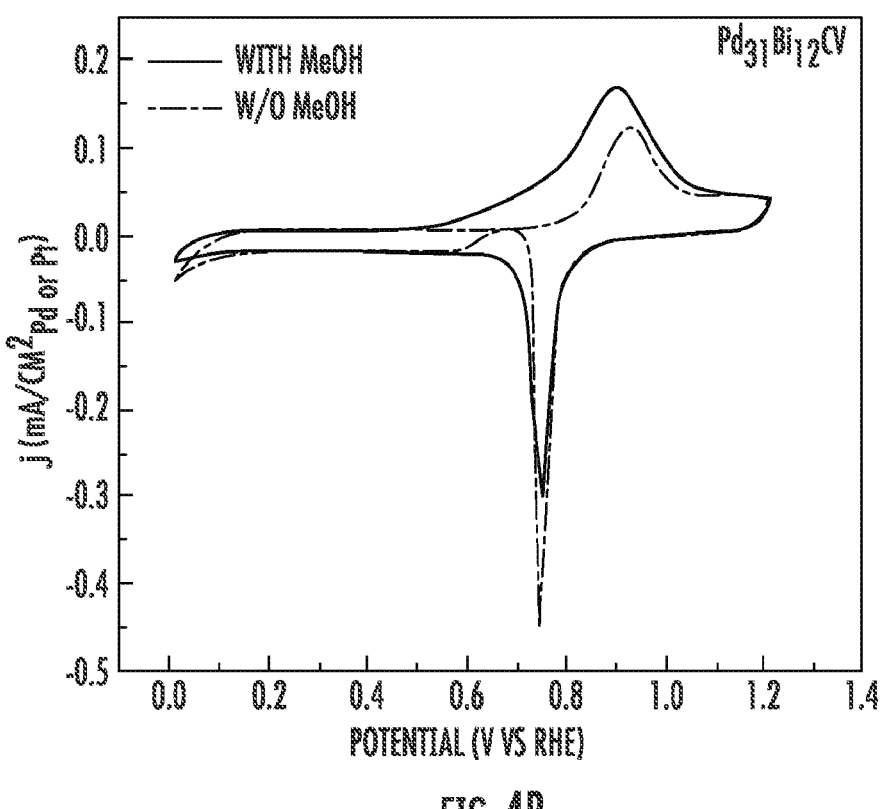
Figure 4C:
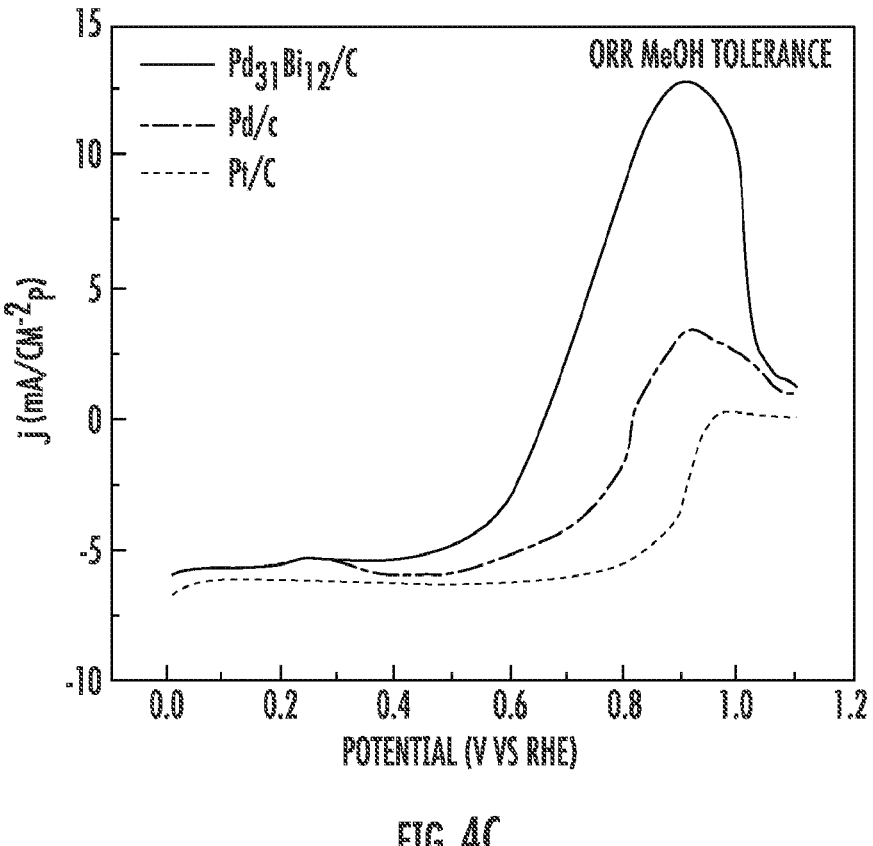

Low-temperature fuel cells can utilize small molecules, such as methanol, for the anode reaction. Alkaline membranes are permeable to methanol, allowing significant crossover of methanol from the anode to the cathode during fuel cell operation. Pt and Pd are both excellent catalysts for the electrooxidation of methanol, however this reaction occurs in the same potential range as ORR, eroding the efficiency of Pt and Pd for performing ORR. Recent studies have shown that multiple neighboring Pt or Pd metal sites (large site ensembles) are required for methanol oxidation to occur, however large site ensembles are not required for ORR. The atomic ordering of the atoms in ordered intermetallic $Pd_{31}Bi_{12}$ will maximize the number of bonds between Pd and Bi, and minimize the number of possible Pd—Pd bonds, leading to small ensembles of Pd sites. Inspection of the crystal structure indicates that the number of Pd—Pd bonds present on the surface varies from 2 to 4 depending on the facet, indicating that $Pd_{31}Bi_{12}$ should be a poor catalyst for methanol oxidation because of low number of Pd ensembles. To test this hypothesis, the oxidation of methanol on N2-saturated 0.1 M KOH with 0.5 M of methanol, as illustrated in FIG. 4A on Pd/C, Pt/C and $Pd_{31}Bi_{12}$/C was measured. The oxidation of methanol can be clearly seen in Pt/C and Pd/C as two characteristic oxidation peaks are observed in the forward and return scans at 0.9-0.95 V and at 0.77 V, respectively. In contrast, the CV of $Pd_{31}Bi_{12}$/C in methanol appears similar to CVs collected in methanol free solution, to provide further insight CVs of $Pd_{31}Bi_{12}$/C with and without methanol in the electrolyte were overlayed, as illustrated in FIGS. 4A and 4C. $Pd_{31}Bi_{12}$/C exhibits a small increase in the baseline current at voltages more positive than 0.5 V when methanol is present in the anodic scan direction, however the peak potential of the anodic wave (~0.9 V) overlaps with the wave collected in a methanol free solution, as illustrated in FIG. 4B. In the return scan, the Pd-oxide reduction peak overlaps with that of methanol-free solutions, and showing a small anodic increase in the current between 0.6 to ~0.7 V. Nevertheless, $Pd_{31}Bi_{12}$/C reacts poorly with methanol, indicating that it should exhibit high methanol tolerance during ORR. To assess the ORR methanol tolerance, ORR electrocatalysis is performed in the presence of 0.5 M methanol, as illustrated in FIG. 4C. The voltammograms indicate that ORR is completely suppressed at voltages more positive than 0.6 V for Pt/C and Pd/C from methanol oxidation, as indicated by the large oxidative wave. The ORR can outcompete methanol oxidation at voltages more negative than 0.6 V, increasing the overpotential for ORR by >200 mV on Pt/C and Pd/C. In contrast, a minor shift of 11 mV is observed for the half-wave potential of $Pd_{31}Bi_{12}$ for ORR, indicating that the presence of methanol hardly interferes with its ORR activity. The minimization of surface Pd—Pd bonds afforded by atomic scale ordering allow $Pd_{31}Bi_{12}$/C to possess superior methanol tolerant ORR behavior.

FIGS. 4A-4C illustrate graphical views of sample characteristics, according to an embodiment of the present invention. FIG. 4A illustrates a graphical view of methanol oxidation on $Pd_{31}Bi_{12}$/C, Pd/C, and Pt/C in N2-saturated 0.1 M KOH with 0.5 M Methanol. FIG. 4B illustrates a graphical view of CV of $Pd_{31}Bi_{12}$/C in N2-saturated 0.1 M KOH with and without methanol. FIG. 4C illustrates a graphical view of ORR on $Pd_{31}Bi_{12}$/C, Pd/C, and Pt/C in N2-saturated 0.1 M KOH with 0.5 M Methanol. All samples were measured at 1600 rpm on a rotating disk electrode with scan rate of 20 mV/s.

Figure 9:
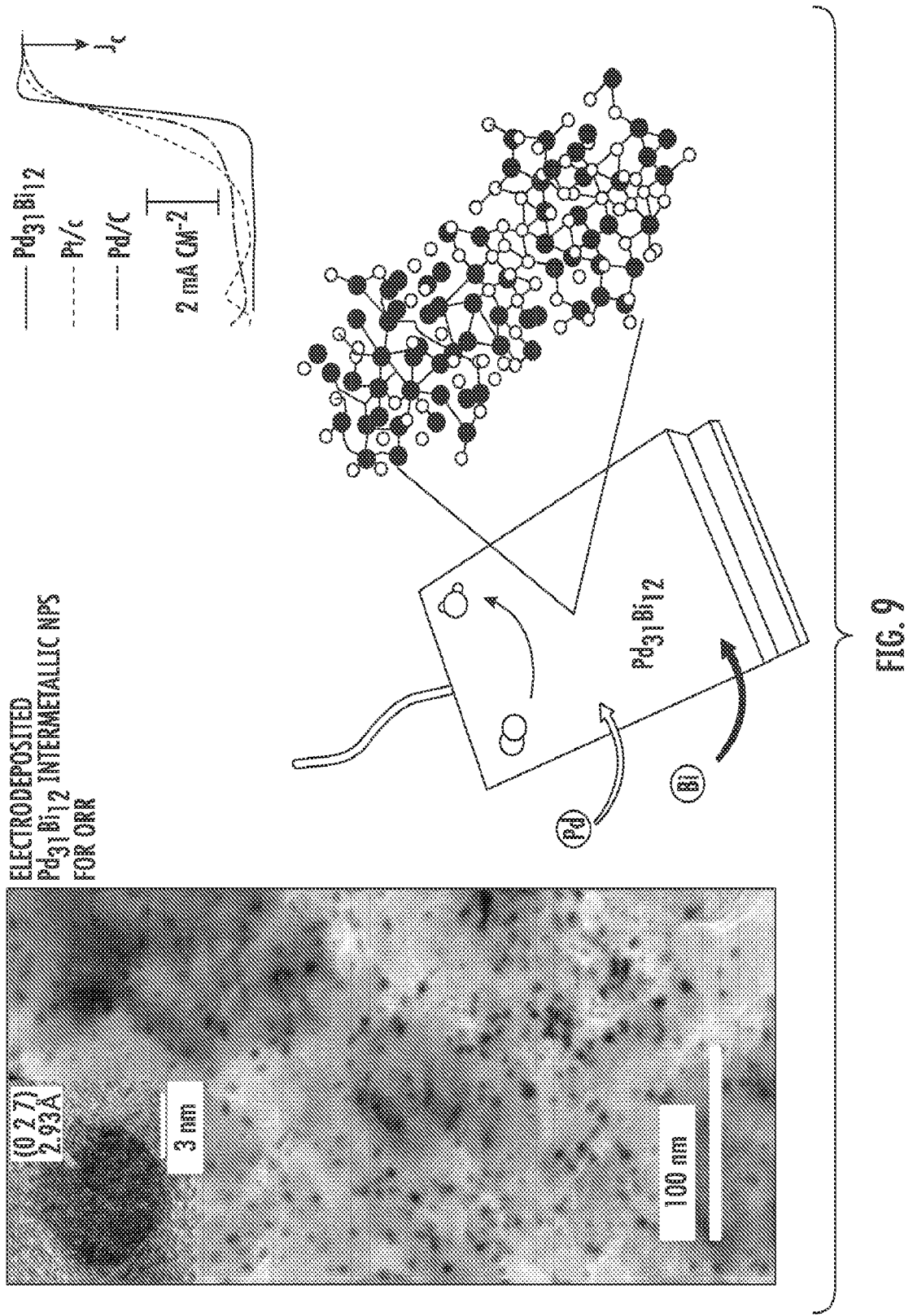
FIG. 9 illustrates an image and schematic view of deposited nanoparticles, according to a method of the present invention.

In summary, as illustrated in FIG. 9, the present invention is directed to a method to prepare nanoparticles of metastable ordered intermetallic compounds at room temperature in a single step. FIG. 9 illustrates an image and schematic view of deposited nanoparticles, according to a method of the present invention. By decoupling nucleation from growth, carbon black supports were homogeneously decorated with $Pd_{31}Bi_{12}$ nanocrystals. The $Pd_{31}Bi_{12}$/C exhibits superior electrocatalytic performance for ORR and excellent methanol tolerant ORR relative to Pd/C and Pt/C. This technique can be extended to synthesize other intermetallic compounds directly on high surface area supports at room temperature.

In an experimental implementation of the present invention that is not meant to be considered limiting, Palladium (II) nitrate hydrate (99.9% metals basis, Alfa Aesar) Bismuth (III) acetate (Bi(oac)3, 99.99%, Alfa Aesar), 40% Pd on Vulcan XC-72 (Premetek Co), O2 gas (UHP grade, Airgas), 40% Pt on High Surface Area Carbon (TEC10E40E, Tanaka Kikinzoku Kogyo TKK), were used as received without purification. Electrolyte solutions were prepared with deionized water (resistance: 18.2 MΩ) and potassium hydroxide (KOH, Semiconductor Grade 99.99%, Alfa Aesar). The ethanol suspension of the nanoparticles was dropcasted onto a zero-background Si wafer substrate and examined with a Philips X'Pert Pro Powder X Ray diffractometer (XRD) with CuK radiation ($K\alpha_1$, $\lambda$=1.5406 Å and $K\alpha_2$, $\lambda$=1.5444 Å). Transmission electron microscopy (TEM) was performed on a FEI F200C Talos or FEI Tecnai TF30 operation at 200 kV. The materials on the glassy carbon disk after electrochemical test was dissolved by concentrated nitric acid and then diluted with water. The metal concentration in the nitric acid solution is analyzed by the PerkinElmer NexION 300D with ICP.

Electrochemical measurements were carried out with a potentiostat/galvanostat (Metrohm Autolab Potentiostat or Nuvant EzStat Pro) and a three-electrode Teflon cell with 0.1 M KOH aqueous solution as the electrolyte. A Hg/HgO electrode in 1 M NaOH was used as the reference electrode. A graphite rod was used as the counter electrode. The Hg/HgO reference electrode was periodically checked with a Reversible Hydrogen Electrode (RHE) to verify the stability of the reference potential. The potential vs the Normal Hydrogen Electrode was determined from the following equation: E(NHE)=$E_{applied}$ (Hg/HgO)+0.14 V. The potential vs RHE was determined with the following equation: E(RHE)=E(NHE)+0.059×pH. ORR was performed by sweeping the voltage from −0.9 V to 0.3 V vs. Hg/HgO at a sweep rate of 20 mv/s, or by constant potential chronoamperometery within the same potential range. All measurements were performed on a 5 mm diameter rotating disk electrode at 1600 rpm. All ORR measurements were IR-corrected, the IR drop was measured by the positive feedback or current interrupt method.

Mass transport correction to obtain the kinetic current density was obtained via the Koutecky-Levich Method. The following expression was used.

$$J_k = \frac{J_{lim} \times J}{J_{lim} - J}$$

Where $J_{lim}$ is the limiting current density, $J_k$ is the kinetic current density, and J is the current density at a given voltage.

To prepare Pd/C materials, 30 mg of 40% Pd on Vulcan XC 72 (Premetek Co) was dispersed into a solution consisting of a mixture of 8 μl Nafion Ionomer, 1 ml DI water and 1 ml IPA. The resulting solution was sonicated for 20 min. The mixture was drop casted onto the 5 mm diameter disk to obtain a mass loading of ~24 μg/cm². The Pt/C sample is prepared with the same procedure except with Pt/C (TKK). Electrodeposited Pd/C and Pt/C were prepared with the same method as $Pd_{31}Bi_{12}$, except only 4 mM $Pd(NO_3)^2$, or 4 mM $Na_2PtCl_4$ were used as the metal sources, respectively.

The Vulcan carbon was suspended in IPA and water (1:1 mixture by vol.) by sonication, then drop casted on the glassy carbon electrode with a loading of ~0.38 mg/cm². $Pd_{31}Bi_{12}$ ordered intermetallics grown directly onto the carbon particles by deposition from an aqueous electrolyte containing 50 mM Ethylenediammenetetracetic acid (EDTA), 25 mM Bi(C2H3O2)³ and 4 mM $Pd(NO_3)^2$ at 30° C. The pulse-on potential was chosen to be −0.35V vs Normal Hydrogen Electrode (NHE, henceforth all potentials will be referenced to this), which is higher than the minimum potential to deposit Pd or Pd—Bi alloy to supply the necessary overpotential for fast nucleation. The pulse-on time was optimized to 30 ms so that the nuclei can form, the pulse-reverse was chosen at 0.65V for 5 s is allow the local Pd cation concentration to relax to equilibrium, providing a uniform concentration profile during the on pulse, thereby decreasing the spatial variations of the potential distribution. After 200 pulse cycles, chronoamperometry at −0.1V is applied for 180 s to grow the deposited nuclei into ordered intermetallic $Pd_{31}Bi_{12}$, during this step a current density around −0.5 mA/cm$^2$ was observed. The as-deposited sample was cleaned to remove organic residue.

After the electrochemical measurement, the glassy carbon electrode was taken out of the electrolyte and rinsed with 18.2 MΩ water. After dried in air, the electrode was placed in a plastic tube and 1 mL concentrated TraceMetal grade nitric acid was added into the tube. The tube was sonicated for a few minutes to fully dissolve the catalyst on the surface. An additional 9 mL of 18.2 MΩ water was added to the tube and the solution is ready for testing.

The CO stripping method is used to determine the electrochemically active surface area (ECSA) of Pt or Pd atoms on the surface of the electrode. The electrodes are first held at 0.15V vs RHE for 20 min in 0.1M KOH saturated with CO to form a surface adsorbed CO monolayer, followed by removal of CO (aq) by saturating the electrolyte with Ar for 15 min. Finally, the voltage was swept from 0.15V to 1.15 V vs RHE to oxidize the adsorbed CO layer, the surface area of the sample can be calculated by integrating the oxidation peak assuming one CO adsorbed per Pd or Pt atom on the surface. The ratio of charge transferred for CO oxidation and metal surface area is estimated as 484 μC/cm$^2$ for Pt and 420 μC/cm$^2$ for Pd and Pd3Bi. Bi sites will not adsorb CO, therefore CO stripping will not account for catalytically inactive Bi sites on the surface.

It should be noted that the system described herein can include a computing device such as a microprocessor, hard drive, solid state drive or any other suitable computing device known to or conceivable by one of skill in the art. The computing device can be programmed with a non-transitory computer readable medium that is programmed with steps to execute the method. The computing device can receive information from the device of the present invention related to the deposition of the nanoparticles, such as when to begin or stop depositing the nanoparticles. The computing device can include a display for showing the status of the material deposition. Alternately, a separate microprocessor or other computing device can be included in the device of the present invention to enable detection and display of information related to the content of the sample. The computing device and/or microprocessor can receive information directly from the device for impedance spectroscopy or other means of detection.

Any such computer application will be fixed on a non-transitory computer readable medium. It should be noted that the computer application is programmed onto a non-transitory computer readable medium that can be read and executed by any of the computing devices mentioned in this application. The non-transitory computer readable medium can take any suitable form known to one of skill in the art. The non-transitory computer readable medium is understood to be any article of manufacture readable by a computer.

Such non-transitory computer readable media includes, but is not limited to, magnetic media, such as floppy disk, flexible disk, hard, disk, reel-to-reel tape, cartridge tape, cassette tapes or cards, optical media such as CD-ROM, DVD, Blu-ray, writable compact discs, magneto-optical media in disc, tape, or card form, and paper media such as punch cards or paper tape. Alternately, the program for executing the method and algorithms of the present invention can reside on a remote server or other networked device. Any databases associated with the present invention can be housed on a central computing device, server(s), in cloud storage, or any other suitable means known to or conceivable by one of skill in the art. All of the information associated with the application is transmitted either wired or wirelessly over a network, via the internet, cellular telephone network, or any other suitable data transmission means known to or conceivable by one of skill in the art.

The many features and advantages of the invention are apparent from the detailed specification, and thus, it is intended by the appended claims to cover all such features and advantages of the invention which fall within the true spirit and scope of the invention. Further, because numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A structural base and deposited material comprising:
high surface area carbon supports; and
$Pd_{31}Bi_{12}$ nanoparticles deposited on the high surface area carbon supports with a pulsed electrochemical deposition, wherein the $Pd_{31}Bi_{12}$ nanoparticles are single crystalline.

2. The base and deposited alloy of claim 1 wherein the $Pd_{31}Bi_{12}$ nanoparticles are smaller than 15 nm.

3. The base and deposited alloy of claim 1 wherein the $Pd_{31}Bi_{12}$ nanoparticles display a 7× enhancement of mass activity relative to Pt/C.

4. The base and deposited alloy of claim 1 wherein the $Pd_{31}Bi_{12}$ nanoparticles display a 4× enhancement for the oxygen reduction reaction (ORR) relative to Pd/C.

5. The base and deposited alloy of claim 1 wherein an isolation of Pd sites from one another facilitate methanol tolerant oxygen reduction reaction (ORR) behavior.

6. The base and deposited alloy of claim 1 wherein the $Pd_{31}Bi_{12}$ nanoparticles are dispersed uniformly on the high surface area carbon supports.

7. The base and deposited alloy of claim 1 wherein $Pd_{31}Bi_{12}$ of the $Pd_{31}Bi_{12}$ nanoparticles is a metastable phase.

8. The base and deposited alloy of claim 1 wherein the $Pd_{31}Bi_{12}$ nanoparticles can be deposited at room temperature.

9. A structural base and deposited material comprising:
high surface area carbon supports; and
$Pd_{31}Bi_{12}$ nanoparticles deposited on the high surface area carbon supports with a pulsed electrochemical deposition, wherein the $Pd_{31}Bi_{12}$ nanoparticles are single crystalline with a lattice spacing of 2.93 Å.

* * * * *